(12) United States Patent
Yasui

(10) Patent No.: US 9,677,832 B2
(45) Date of Patent: Jun. 13, 2017

(54) LIQUID COOLING SYSTEM FOR ELECTRIC COMPONENT MOUNTED IN AIRCRAFT

(71) Applicant: Nabtesco Corporation, Tokyo (JP)

(72) Inventor: Tsutomu Yasui, Gifu (JP)

(73) Assignee: Nabtesco Corporation, Tokyo (JP)

( * ) Notice: Subject to any disclaimer, the term of this patent is extended or adjusted under 35 U.S.C. 154(b) by 840 days.

(21) Appl. No.: 13/896,527

(22) Filed: May 17, 2013

(65) Prior Publication Data

US 2013/0312934 A1    Nov. 28, 2013

(30) Foreign Application Priority Data

May 25, 2012    (JP) ................................. 2012-119500

(51) Int. Cl.
| | |
|---|---|
| *H05K 7/20* | (2006.01) |
| *F16K 31/12* | (2006.01) |
| *F28F 27/02* | (2006.01) |
| *F16K 31/00* | (2006.01) |
| *G05D 23/02* | (2006.01) |

(52) U.S. Cl.
CPC ............ *F28F 27/02* (2013.01); *F16K 31/002* (2013.01); *G05D 23/025* (2013.01); *H05K 7/20281* (2013.01)

(58) Field of Classification Search
CPC .. H05K 7/20281; F25B 41/06; G05D 23/025; G05D 23/08; F16K 31/002; F16K 31/025; H01H 37/56
See application file for complete search history.

(56) References Cited

U.S. PATENT DOCUMENTS 2,335,389 A * 11/1943 Coons ..................... F25B 15/10
62/105
2,424,250 A * 7/1947 Nathan .................. H01H 37/56
337/351

(Continued)

FOREIGN PATENT DOCUMENTS

JP    S49-60021 A    6/1974
JP    63-133680 U    12/1989

(Continued)

OTHER PUBLICATIONS

Office Action in corresponding Japanese Application Tokugan No. 2012-119500, dated Feb. 2, 2016 (6 pages).

(Continued)

*Primary Examiner* — Cassey D Bauer
(74) *Attorney, Agent, or Firm* — Osha Liang LLP

(57) ABSTRACT

To provide a liquid cooling system for an electric component mounted in an aircraft, in which a flow rate of a coolant fed to the electric component mounted in the aircraft is optimized by a simple method, a liquid cooling system 1 for an electric component mounted in an aircraft adopts a flow rate adjusting valve which is a thermostat valve 5 such that the opening degree of the valve increases with an increase in the temperature of the coolant flowing into the flow rate adjusting valve so as to raise the flow rate of the coolant fed to the electric component 50, and the opening degree of the valve decreases with a decrease in the temperature of the coolant flowing into the flow rate adjusting valve so as to reduce the flow rate of the coolant fed to the electric component 50.

3 Claims, 4 Drawing Sheets

(56) References Cited

U.S. PATENT DOCUMENTS

| | | | | |
|---|---|---|---|---|
| 5,479,786 | A | * | 1/1996 | Giasson .............. B60H 1/00485 236/101 D |
| 6,058,730 | A | * | 5/2000 | Giasson ................ F25B 41/062 236/101 D |
| 7,963,119 | B2 | * | 6/2011 | Campbell .................. G06F 1/20 165/104.33 |
| 2004/0057211 | A1 | | 3/2004 | Kondo et al. |
| 2007/0017239 | A1 | * | 1/2007 | Monson .................. F28F 27/02 62/222 |
| 2009/0219692 | A1 | | 9/2009 | Wavering et al. |

FOREIGN PATENT DOCUMENTS

| | | |
|---|---|---|
| JP | 63-151915 U | 12/1989 |
| JP | 02-055072 U | 11/1991 |
| JP | H07-63143 A | 3/1995 |
| JP | 06-060190 U | 9/1995 |
| JP | 2004-246615 A | 3/2006 |
| WO | 2009110412 A1 | 9/2009 |

OTHER PUBLICATIONS

Office Action in corresponding Japanese Application No. 20525004, dated Feb. 2, 2016 (6 pages).

Office Action in corresponding Japanese Application No. 2012-119500, dated Jun. 14, 2016 (10 pages).

\* cited by examiner

LIQUID COOLING SYSTEM FOR ELECTRIC COMPONENT MOUNTED IN AIRCRAFT

CROSS REFERENCE TO RELATED APPLICATION

The present application claims priority from Japanese Patent Application No. 2012-119500, which was filed on May 25, 2012, the disclosure of which is herein incorporated by reference in its entirety.

BACKGROUND OF THE INVENTION

1. Technical Field

The present invention relates to a liquid cooling system for cooling electric components mounted in an aircraft with a use of coolant.

2. Background Art

For example, Pamphlet of International Publication WO 2009/110412 (hereinafter, PTL 1) describes a technology for cooling electric components mounted in an aircraft (hereinafter, simply referred to as electric components) with a use of a coolant. The rack 2 described in PTL 1 is a rack for accommodating liquid-cooled electronic units 50 (electric components) and has a plurality of electric connectors 12 for supplying electricity to a plurality of electronic units 50; and a plurality of fluid connectors 14 for feeding a coolant to the electronic units 50. Each of the fluid connectors 14 has two openings 22a and 22b. When a fluid connectors 56 provided to a flange 52 of an electronic unit 50 are connected to these openings, the coolant is fed through the opening 22a to the electronic unit 50, and the coolant having cooled the electronic unit is collected through the opening 22b. This way, cooling of the electronic unit 50 is always performed.

Although PTL 1 does not disclose any liquid cooling system for feeding the coolant to the electronic unit 50, for example, the following liquid cooling system has been traditionally known. Namely, as shown in FIG. 4, a liquid cooling system 100 includes: a pump 101 configured to feed a coolant to an electric component 200, a coolant feeding path 102 provided with the pump 101 and having one of its end connected to the electric component 200; a coolant discharging path 103 whose one end is connected to the electric component 200, and through which the coolant having cooled the electric component 200 flows; and an orifice 104 which regulates the flow rate so as to prevent an excessive flow rate of the coolant in the electric component 200 connected to the coolant discharging path

SUMMARY OF THE INVENTION

Technical Problems

However, in the liquid cooling system shown in FIG. 4, the flow rate of the coolant fed to the electric component is always constant and is the flow rate that removes the heat when the electric component generates the maximum heat, and variation in the amount of heat generated by the electric component is not taken into account. As such, the flow rate of the coolant fed to the electric component is not optimized, which necessitates extra operation costs. Particularly, in cases where a plurality of electric components are mounted, although all the electric components are hardly operated at the same time, it is necessary to feed the coolant at the flow rate sufficient for all the electric components. This leads not only to the extra operation costs, but also to an increase in the size of the liquid cooling system.

An approach to optimize the flow rate of the coolant fed to the electric component is, for example, to adopt a control device or the like to measure the temperature or the like of a cooling water after the cooling water is used for cooling the electric component, and adjust the amount of coolant fed to the electric component according to the measurement result. However, such a method requires introduction of a control device or the like, which leads to an increase in the costs for the facility and operation of the liquid cooling system and may not provide sufficient solution.

The present invention is made in view of the above problem, and it is an object of the present invention to provide a liquid cooling system for an electric component to be mounted in an aircraft, the system adopting a simple method to optimize the flow rate of the coolant fed to the electric component to be mounted in an aircraft.

Technical Solution

To achieve the above object, a liquid cooling system of the present invention for an electric components mounted in an aircraft includes: a pump configured to feed a coolant to the electric component; a coolant feeding path connected to the electric component and coupled with the pump; a coolant discharging path connected to the electric component, in which the coolant having cooled the electric component flows; and a flow rate adjusting valve provided to the coolant discharging path, which is configured to adjust a flow rate of the coolant fed to the electric component. The flow rate adjusting valve is a thermostat valve configured so that an opening degree of the valve increases with an increase in the temperature of the coolant flowing into the flow rate adjusting valve so as to raise the flow rate of the coolant fed to the electric component, and the opening degree of the valve is decreased with a decrease in the temperature of the coolant flowing into the flow rate adjusting valve so as to reduce the flow rate of the coolant fed to the electric component.

Advantageous Effects

The present invention having a thermostat valve provided to the coolant discharging path through which the coolant having cooled the electric component flows realizes a liquid cooling system for an electric component mounted in an aircraft, in which system the flow rate of the coolant fed to the electric components mounted in the aircraft is easily optimized.

BRIEF DESCRIPTION OF THE DRAWINGS

FIG. 3 (b) is a cross sectional view taken along III (b)-III (b); and FIG. 3 (c) is a cross sectional view corresponding to that taken along III (b)-III (b), showing a case where a thermosensitive deformation member of the thermostat valve is not deformed.

DESCRIPTION OF THE PREFERRED EMBODIMENTS

Figure 1:
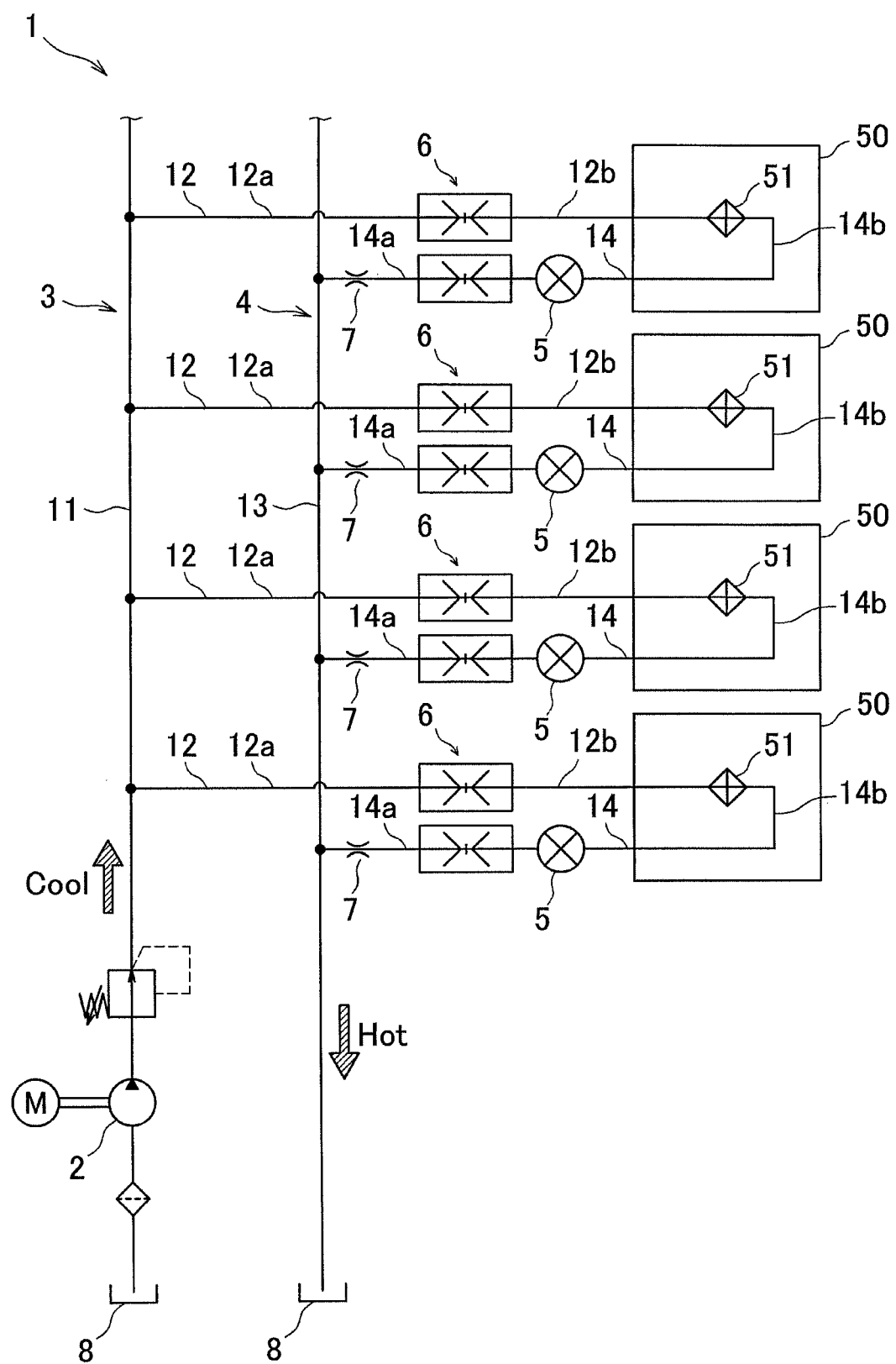
FIG. 1 is a schematic diagram of an embodiment of the present invention, and shows a liquid cooling system for electric components mounted in an aircraft.
Figure 2:
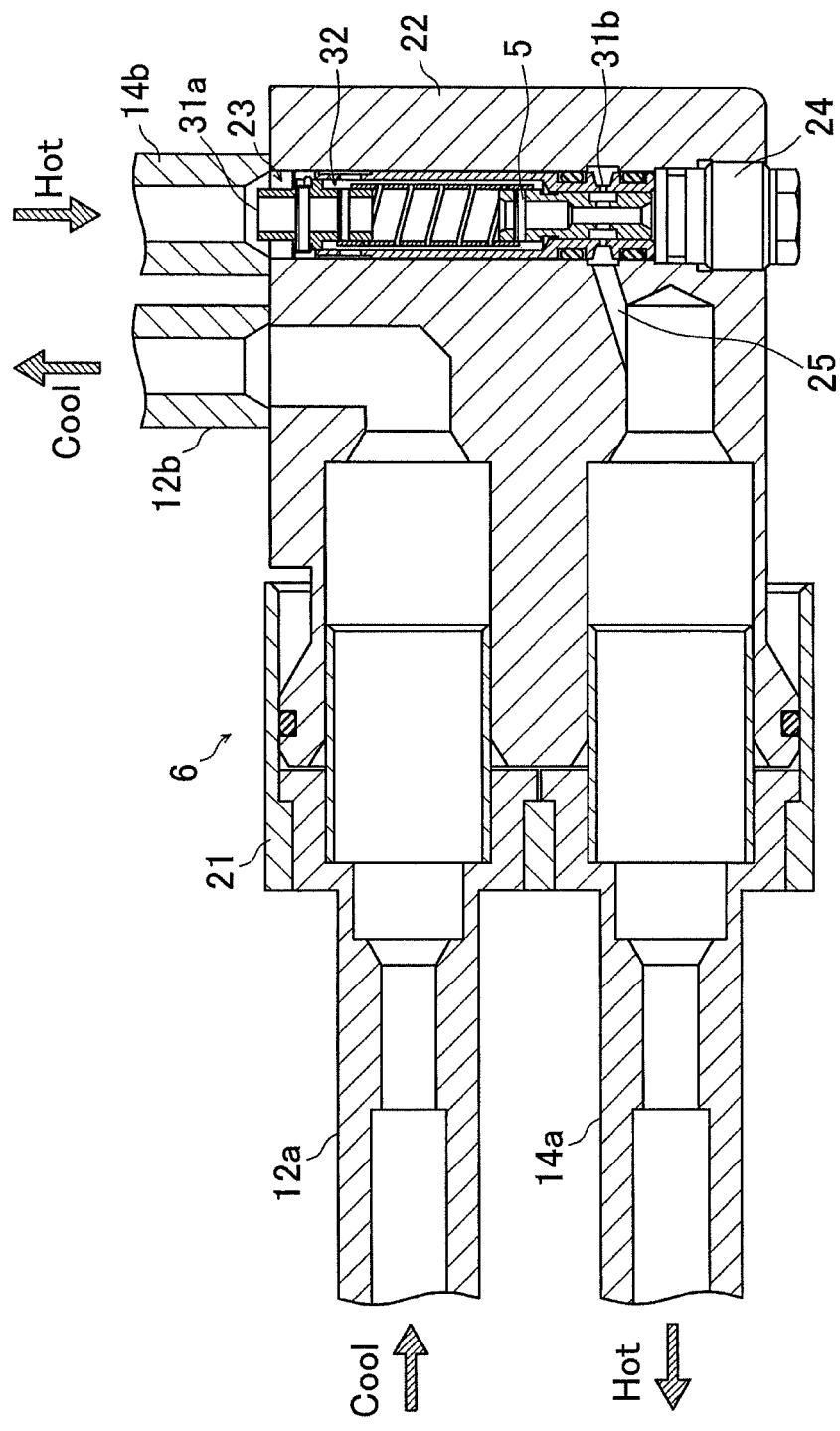
FIG. 2 is a cross sectional view of a quick disconnect coupling and a thermostat valve shown in FIG. 1.
Figure 3A:
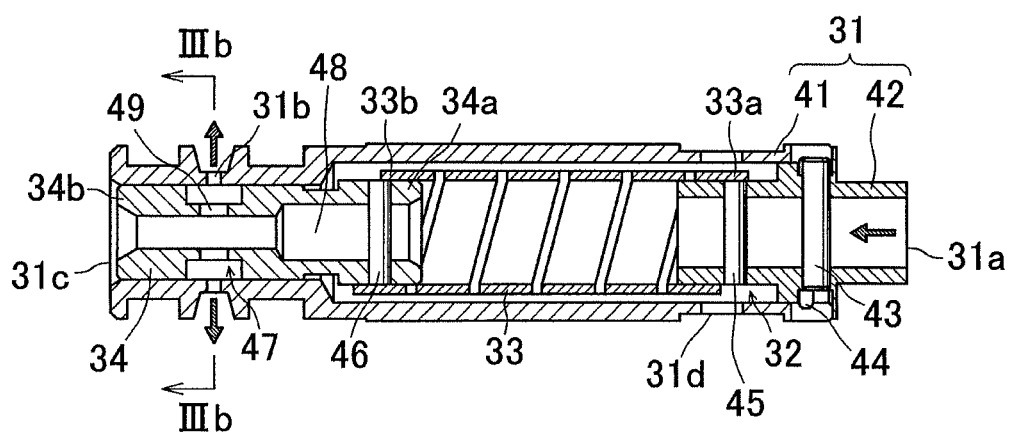
FIG. 3 (a) is an enlarged view of a thermostat valve shown in FIG. 2.
Figure 3B:
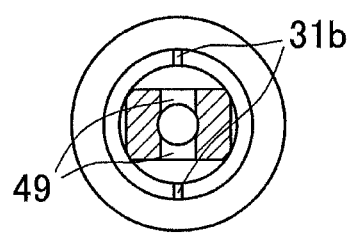
Figure 3C:
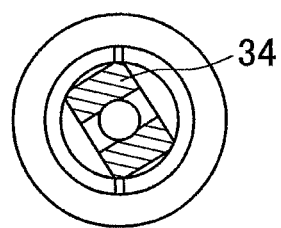
Figure 4:
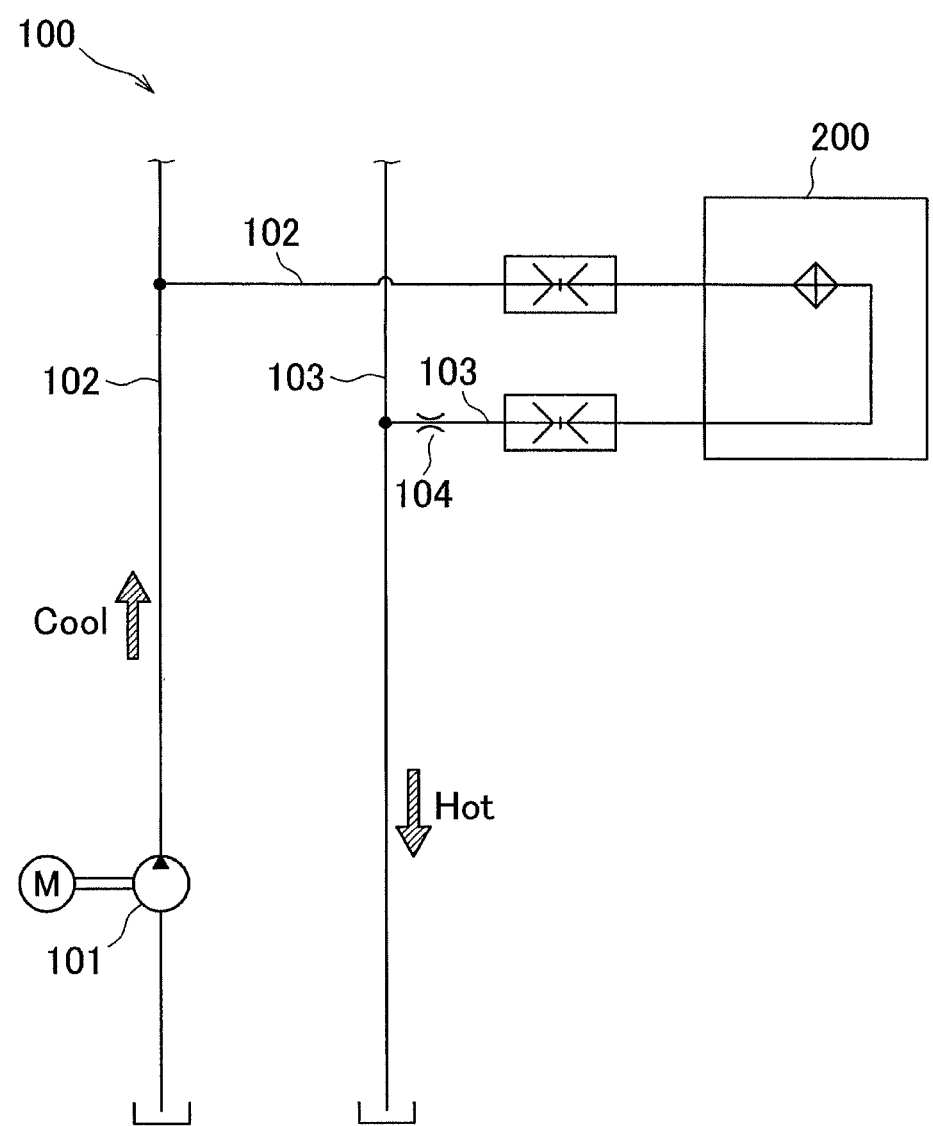
FIG. 4 is a schematic diagram showing a traditional liquid cooling system for an electric component mounted in an aircraft.

The following describes a preferable mode of a liquid cooling system for an electric component mounted in an aircraft according to the present invention, with reference to FIG. 1 to FIG. 3.

(Liquid Cooling System 1 for Electric Component Mounted in Aircraft)

A liquid cooling system 1 for an electric component mounted in an aircraft (Hereinafter also simply referred to as liquid cooling system 1) includes: a pump 2, a coolant feeding path 3, a coolant discharging path 4, a thermostat valve 5 (flow rate adjusting valve), a quick disconnect coupling 6, an orifice 7, and a tank 8, as shown in FIG. 1. The liquid cooling system 1 is used as a system for cooling an electric component (e.g., control unit, power unit) mounted in an aircraft, with a use of a coolant.

(Pump 2)

The pump 2 is a pump for feeding a low temperature coolant (hereinafter, also referred to as low-temperature coolant) (e.g., 20° C.) to the electric components 50. A hydraulic pump is suitably adoptable as the pump 2; however, the pump 2 is not limited to a hydraulic pump.

(Coolant Feeding Path 3)

The coolant feeding path 3 is a feeding path for feeding the low-temperature coolant to the electric components 50, and includes a main passage 11 (feeding-side main passage) provided with the pump 2, and a plurality of branched paths 12 (feeding-side branched paths) branched off from the main passage 11.

The main passage 11 has one end connected to the tank 8, and the branched paths 12 connect the main passage 11 with the electric components 50. Activating the pump 2 causes the low-temperature coolant stored in the tank 8 to flow in the main passage 11, branch into the branched paths 12, and then flows to the electric components 50.

Each branched path 12 includes a first path 12a and a second path 12b which are distinguished from each other by the quick disconnect coupling 6. The first path 12a has one end connected to the main passage 11 and another end attached to the quick disconnect coupling 6. The second path 12b has one end attached to the quick disconnect coupling 6 and another end connected to a heat exchanger 51 in the electric component 50. The low-temperature coolant having been fed to the electric component 50 exchanges the heat with a heat source of the electric component 50 in the heat exchanger 51 to cool down the electric component 50. Note that the quick disconnect coupling 6 is a detachable coupling, and a one-touch coupling or the like is adoptable as the quick disconnect coupling 6. Further, the heat exchanger 51 may be anything capable of cooling the electric component 50, and there is no specific limitation on the shape or the like of the heat exchanger 51.

(Coolant Discharging Path 4)

The coolant discharging path 4 is a discharging path for discharging the coolant (hereinafter, also referred to as high-temperature coolant) having cooled the electric component 50 from the electric component 50, and includes a main passage 13 (discharging-side main passage) whose one end is connected to the tank 8, and a plurality of branched paths 14 (discharging-side branched paths) connecting the electric components 50 with the main passage 13.

The main passage 13 is a discharging path at which flows of high-temperature coolant discharged from the electric components 50 into the branched paths 14 are combined. The combined flow of the high-temperature coolant is cooled in a not-shown heat exchanger to become the low-temperature coolant, stored in the tank 8, and reused. The high-temperature coolant may be stored as it is in the tank 8, and then cooled down in a not-shown heat exchanger.

Each branched path 14 includes a third path 14a and a fourth path 14b which are distinguished from each other by the quick disconnect coupling 6. The third path 14a has one end connected to the main passage 13 and another end attached to the quick disconnect coupling 6. The third path 14a has an orifice 7, and with this orifice 7, the flow rate of the coolant to the electric component 50 is kept from exceeding a certain level. On the other hand, the fourth path 14b has one end attached to the quick disconnect coupling 6 and another end connected to the heat exchanger 51 in the electric component 50. Note that this specification describes "second path 12b" and "fourth path 14b" as separate paths (passage) divided by the heat exchanger 51, for the sake of easier explanation; however, these paths are actually the same path. Note further that the orifice 7 may be omitted.

(Thermostat Valve 5)

The thermostat valve 5 (flow rate adjusting valve) is a valve for adjusting the flow rate of the low-temperature coolant feed to the electric component 50, and is provided to each of the branched paths 14 (discharging-side branched paths). Although the thermostat valve 5 is separately drawn from the quick disconnect coupling 6 in FIG. 1, for the sake of convenience, the thermostat valve is actually provided inside the quick disconnect coupling 6.

The "thermostat valve" in the present embodiment is a valve configured to mechanically adjust the opening degree according to the temperature of a medium flowing into the valve. In the present embodiment, the thermostat valve 5 increases the opening degree of the valve with an increase in the temperature of the high-temperature coolant flowing into the valve so as to increase the flow rate of the low-temperature coolant to the electric component 50, while decreasing the opening degree of the valve with a decrease in the temperature of the high-temperature coolant flowing into the valve so as to reduce the flow rate of the low-temperature coolant to the electric component 50.

The following describes in detail the structure of the thermostat valve 5 with reference to FIG. 2 and FIG. 3.

First, the following briefs the quick disconnect coupling 6 in which the thermostat valve 5 is provided. As shown in FIG. 2, the quick disconnect coupling 6 includes a first coupling 21 connecting to the first path 12a and the third path 14a, and a second coupling 22 connecting to the second path 12b and the fourth path 14b.

The quick disconnect coupling 6 is structured as follows. Namely, when the first coupling 21 and the second coupling 22 are connected to each other, valves provided to the first coupling 21 and the second coupling 22 open, communicating the first path 12a with the second path 12b and the third path 14a with the fourth path 14b, thus circulating the coolant in the tank 8 and the electric component 50. On the other hand, when the first coupling 21 and the second coupling 22 are disconnected from each other, the valves close and the circulation of the coolant is stopped.

Next described is the thermostat valve 5. The thermostat valve 5 is provided inside the second coupling of the quick disconnect coupling 6, and more specifically, is provided in a communication path 23 of the third path 14a and the fourth path 14b. This communication path 23 has both ends opened. One end is connected to and in communication with the fourth path 14b, and another end is closed by a bolt 24. Further, in a midway portion of the communication path 23 is a coolant discharging path 25 communicating with the first coupling 21. The high-temperature coolant discharged from the electric component 50 flows into the thermostat valve 5 via the intake port 31a of the thermostat valve 5, and then flows into the third path 14a via the discharge port 31b and the coolant discharging path 25.

As shown in FIG. 3, the thermostat valve 5 has a valve housing 31 having therein a valve actuation chamber 32; a thermosensitive deformation member 33 provided to the valve actuation chamber 32; and a valve 34 attached to the thermosensitive deformation member 33 and configured to adjust the opening degree of the discharge port 31b.

The valve housing 31 has a housing main body 41 in a substantially hollow cylindrical shape; a having substantially a shaft member 42 having substantially a hollow cylindrical shape, which is inserted into one end of the housing main body 41 and fixed to the housing main body 41 by a fixing pin 43 and a ring lock 44. The ring lock 44 is a metal ring having a C-shape, when viewed from a direction perpendicular to the axial direction of the shaft member 42. The valve housing 31 is made of stainless steel (other metal materials are adoptable, and not limited to a metal material).

The valve housing 31 has an intake port 31a for letting the high-temperature coolant flow into the valve actuation chamber 32, a discharge port 31b configured to discharge the high-temperature coolant having flown into the valve actuation chamber 32; and other openings 31c and 31d. As shown in FIG. 3 (b), the discharge port 31b includes two holes having a small diameter. The opening 31c is in contact with the bolt 24 (see FIG. 2), and the openings 31d is in contact with the second coupling 22 (see FIG. 2). Therefore, these openings 31c and 31d do not relate to introduction and discharging of the high-temperature coolant.

The thermosensitive deformation member 33 is bimetal having two layers of metal plates having different coefficient of thermal expansion, and has a helical shape (spiral shape). Of the two layers of metal plates, the one on the inner side is made of a metal having a low coefficient of thermal expansion, and the one on the outer side is made of a metal with a high coefficient of thermal expansion. This way the thermosensitive deformation member 33 displaces in a winding direction of the helical shape. Examples of the metal materials used for the thermosensitive deformation member 33 includes: iron, nickel, manganese, chrome, copper, or an alloy of any of these metals. Using these materials, the coefficient of thermal expansion including two layers of different metal plates is formed. Note however the metal materials are not limited to these.

The thermosensitive deformation member 33 has one end 33a serving as a fixed end which is fixed to the shaft member 42 by a pin 45. This fixed end does not displace when the high-temperature coolant flows into the valve actuation chamber 32. On the other hand, to another end 33b of the thermosensitive deformation member 33 is attached the valve 34 by a pin 46. The other end 33b however is a free end, and displaces in the winding direction of the helical shape (substantially in the circumferential direction of the thermosensitive deformation member 33), when the high-temperature coolant flows into the valve actuation chamber 32.

The valve 34 is for adjusting the opening degree of the discharge port 31b, and has substantially a hollow cylindrical shape. The valve 34 has one end 34a attached to the other end 33b of the thermosensitive deformation member 33, and another end 34b extended to a position nearby the openings 31c of the valve housing 31. Further, the outer wall of the valve 34 abuts or approximates the inner wall of the valve housing 31. The opening degree adjusting unit 47 formed in the midway portion of the valve 34 adjusts the opening degree of the discharge port 31b.

As shown in FIG. 3 (b), the cross section of the opening degree adjusting unit 47 taken in a direction perpendicular to the axial direction of the valve 34 has substantially a rectangular shape (i.e., the exterior appearance of the opening degree adjusting unit 47 is substantially in a shape of rectangular parallel piped), and has a communication path 49 communicating the discharge port 31b with a hollow portion 48 formed inside the valve 34.

The opening degree of the discharge port 31b is the greatest when the communication path 49 is positioned so as to face the discharge port 31b as shown in FIG. 3 (b). On the other hand, the opening degree of the discharge port 31b is the smallest when the valve 34 rotates to close the discharge port 31b, as shown in FIG. 3 (c). Note however that the valve 34 never closes the discharge port 31b completely, and the discharge port 31b is always in communication with the coolant discharging path 25 (see FIG. 2). Note that the valve 34 is made of a stainless steel (other metal materials are adoptable, and not limited to a metal material).

The thermostat valve 5 as structured above, when the high-temperature coolant discharged from the electric component 50 flows into the valve actuation chamber 32 via the intake port 31a, the thermosensitive deformation member 33 expands in the winding direction of the helix (substantially in the circumferential direction of the thermosensitive deformation member 33), due to the effect of the bimetal, i.e., the metal with a higher coefficient of thermal expansion deforms more significantly than the metal with the lower coefficient of thermal expansion, and the other end 33b of the thermosensitive deformation member 33 displaces mainly in the circumferential direction. Then, the valve 34 attached to the other end 33b rotates with the deformation of the other end 33b. As the result, the opening degree of the discharge port 31b changes, increasing/decreasing the flow rate of the high-temperature coolant in the fourth path 14b to the third path 14a. This increases or decreases the flow rate of the low-temperature cooling water fed to the electric component 50.

For example, when no high-temperature coolant is flowing or when the electric component 50 generates almost no heat and there is little difference between the temperatures of the low-temperature coolant and the high-temperature coolant, the actuation length of the thermosensitive deformation member 33 (i.e., the length of thermosensitive deformation member 33 (the length of helix when straightened)) is the natural length. In this case, the valve 34 is in the state where the opening degree of the discharge port 31b is the smallest, as shown in FIG. 3 (c). As the result, the flow rate of the low-temperature cooling water fed to the electric component 50 is kept low.

On the other hand, when the amount of heat generated by the electric component 50 increases and the temperature of the high-temperature coolant flowing into the valve actuation chamber 32 increases, the thermosensitive deformation member 33 deforms with an increase in the temperature (actuation length extends). The amount of displacement of the other end 33b of the thermosensitive deformation member 33 in the circumferential direction increases with an increase in the temperature. This gradually rotates the valve 34 to gradually increase the opening degree of the discharge port 31b. As the result, the flow rate of the low-temperature cooling water fed to the electric component 50 increases gradually.

When the heat generation of the electric component is at its maximum level, the valve 34 rotates by a maximum angle, making the opening degree of the discharge port 31*b* greatest as shown in FIG. 3 (*b*). As the result, the flow rate of the low-temperature cooling water fed to the electric component 50 is maximized.

On the other hand, when the heat generation by the electric component 50 is weakened and the temperature of the high-temperature coolant flowing into the valve actuation chamber 32 is lowered, the thermosensitive deformation member 33 constricts down to its natural length with the decrease in the temperature, and the amount of displacement of the other end 33*b* of the thermosensitive deformation member 33 returns to the state before the deformation, with the decrease in the temperature. This gradually rotates the valve 34 towards its original position to gradually reduce the opening degree of the discharge port 31*b*. As the result, the flow rate of the low-temperature cooling water fed to the electric component 50 is gradually reduced.

Note that, while the thermosensitive deformation member 33 significantly deforms in the circumferential direction, it tends to deform in other directions too: e.g., in the axial direction of the thermosensitive deformation member 33, a direction perpendicular to the axial direction, or the like. However, since the valve 34 contacts the valve housing 31 and the bolt 24, it is hardly displaced in these directions. Therefore, displacement of the thermosensitive deformation member 33 in these directions is restrained by the valve 34. As the result, the thermosensitive deformation member 33 is hardly displaced in these directions (axial direction, and a direction perpendicular to the axial direction).

(Modifications)

The present embodiment deals with a case where the thermosensitive deformation member 33 is a bimetal; however, the thermosensitive deformation member 33 is not limited to a bimetal. Other materials are also adoptable as long as the amount of displacement of the other end 33*b* increases with an increase in the temperature of the high-temperature coolant, and decreases with a decrease in the temperature of the high-temperature coolant.

Further, the present embodiment deals with a case where the thermosensitive deformation member 33 has a helical shape for the reasons that a sufficient amount of deformation of the thermosensitive deformation member 33 is ensured while downsizing the thermostat valve 5; the opening degree of the discharge port 31*b* is adjustable by rotation of the valve 34 (only a small space is needed for the valve 34) or the like. However, the thermosensitive deformation member 33 is not limited to ones with a helical shape. For example, the thermosensitive deformation member 33 may be in a plate-like shape or a U-shape.

Further, the present embodiment deals with a case where the intake port 31*a* in communication with the fourth path 14*b* serves as the intake port of the high-temperature coolant, and where the discharge port 31*b* in communication with the coolant discharging path 25 serves as a discharge port of the high-temperature coolant. However, the direction of the high-temperature coolant flowing may be reversed; i.e., the discharge port 31*b* of the present embodiment may serve as the intake port of the high-temperature coolant and the intake port 31*a* of the present embodiment may serve as the discharge port of the high-temperature coolant.

Further, the present embodiment deals with a case where the thermostat valve 5 is provided inside the quick disconnect coupling 6; however, the thermostat valve 5 may be provided in the branched path 14 (discharging-side branched path). It is also possible to omit the quick disconnect coupling 6.

Further, the present embodiment deals with a case where the thermostat valve 5 is provided in each of the branched path 14 (discharging-side branched path); however, it is possible to provide a single thermostat valve 5 in the main passage 13(discharging-side main passage). However, in this case, the thermostat valve 5 is preferably provided downstream of all the connecting portions where the main passage 13 and the branched paths 14 are connected.

Further, the present embodiment deals with a case of having a plurality of electric components 50. However, the above-described structure is also applicable to a case where the number of electric components 50 is one. In such a case, the coolant feeding path 3 and the coolant discharging path 4 may be a single tube, without the branched paths branched off from the main passage.

The liquid cooling system 1 of the present embodiment may be connected to a not-shown rack for accommodating electric components 50. Specifically, a part of the main passages 11 and 13, the first path 12*a*, and the third path 14*a* are built in a support of the rack. On the surface of the support is attached the first coupling 21. The second coupling 22 accommodating therein the thermostat valve 5 is coupled with the first coupling 21, and then the third path 14*a* and the fourth path 14*b* connected to the electric component 50 in advance are coupled with the second coupling 22, thus enabling circulation of the coolant. It is possible to provide a not-shown electric connector to this rack to enable supply of electricity to the electric component 50.

The present embodiment deals with a case where the thermostat valve 5 is structured so that the opening degree of the valve increases with an increase in the temperature of the medium flowing into the valve so as to raise the flow rate of the medium, and the opening degree of the valve decreases with a decrease in the temperature of the medium flowing into the valve so as to reduce the flow rate of the medium.

However, use of the thermostat valve acting in the opposite way to the thermostat valve of the present embodiment is possible by, for example, changing the initial position of the valve of the thermostat valve. More specifically, the thermostat valve may be structured so that the opening degree of the valve increases with a decrease in the temperature of the medium flowing into the thermostat valve so as to raise the flow rate of the medium, and the opening degree of the valve is decreased with an increase in the temperature of the medium flowing into the valve so as to reduce the flow rate of the medium.

For example, some electric components mounted in the aircraft have low low-temperature characteristics. When an electric component is refrigerated or kept at a low temperature to be frozen in the aircraft, the other surrounding devices may also be frozen.

In such a case, with a use of the thermostat valve and a high-temperature humidifying liquid (e.g., 50°) or the like as the medium, it is possible to cause a large amount of humidifying liquid to flow in the electric component when the temperature of the electric component is low, and reduce the flow rate of the humidifying liquid to the electric component after the temperature of the electric component rises. This efficiently maintain the temperatures of the electric components at high temperatures, thus preventing freezing of the electric components.

(Effects)

(Effect 1)

The following describes advantageous effects of the present invention. A liquid cooling system of the present invention for an electric component mounted in an aircraft includes: a pump configured to feed a coolant to an electric component; a coolant feeding path connected to the electric component and coupled with the pump; a coolant discharging path connected to the electric component, in which the coolant having cooled the electric component flows; and a flow rate adjusting valve provided to the coolant discharging path, which is configured to adjust a flow rate of the coolant fed to the electric component. The flow rate adjusting valve is a thermostat valve configured so that an opening degree of the valve increases with an increase in the temperature of the coolant flowing into the flow rate adjusting valve so as to raise the flow rate of the coolant fed to the electric component, and the opening degree of the valve is decreased with a decrease in the temperature of the coolant flowing into the flow rate adjusting valve so as to reduce the flow rate of the coolant fed to the electric component.

With the actuation of the thermostat valve, the flow rate of the coolant fed to the electric component is easily optimized without a use of a control device. As the result, there is provided a liquid cooling system for an electric component mounted in an aircraft, which is capable of optimizing the flow rate of coolant fed to the electric component while restraining the facility costs and operation costs.

(Effect 2)

The thermostat valve adopted in the present invention includes: a valve housing in which a valve actuation chamber is formed therein, the valve housing having an intake port and a discharge port of the coolant; a thermosensitive deformation member disposed in the valve actuation chamber so that one end thereof serves as a fixed end fixed to the valve housing and another end serves as a free end, the thermosensitive deformation member deforming according to the temperature of the coolant flowing into the valve actuation chamber; and a valve attached to the other end of the thermosensitive deformation member, which adjusts the opening degree of the intake port or the discharge port with displacement of the other end. Thus, deformation of the thermosensitive deformation member displaces the valve, thereby adjusting the opening degree of the intake port or the discharge port. This enables a simple structure of the thermostat valve, and makes it possible to optimize the flow rate of the coolant fed to the electric component while restraining an increase in the costs of the liquid cooling system.

(Effect 3)

Further, the thermosensitive deformation member is a bimetal formed in a helical shape, including two different metal plates with different coefficients of thermal expansion are laminated, and the valve rotates with deformation of the bimetal to adjust the opening degree of the intake port or the discharge port. Since the thermosensitive deformation member is a bimetal formed in a helical shape, it is possible to make the actuation length of the bimetal long despite the limited space. This ensures sufficient amount of deformation of the thermosensitive deformation member, while downsizing the thermostat valve. Forming the thermosensitive deformation member in a helical shape enables the valve to adjust the opening degree of the intake port or the discharge port, by rotating with deformation of the thermosensitive deformation member. This reduces the space for arranging the valve, and enables downsizing of the thermostat valve.

(Effect 4)

Further, the electric component and the coolant feeding path, and the electric component and the coolant discharging path are made detachable with a use of the quick disconnect coupling. This makes replacement of the electric components easily.

(Effect 5)

Further, the coolant feeding path has a feeding-side main passage to which a pump is provided, and a plurality of feeding-side branched paths connecting the feeding-side main passage with a plurality of the electric components, and the coolant discharging path has a discharging-side main passage and a plurality of discharging-side branched paths connecting the discharging-side main passage with the electric components. The thermostat valve is provided to each of the discharging-side branched paths. Therefore, the flow rate of the coolant fed is optimized for each of the electric components. This enables downsizing of piping such as the feeding-side main passage and the discharging-side main passage and each component such as the pump and the tank. As the result, it is possible to downsize the overall liquid cooling system.

Thus, an embodiment of the present invention is described hereinabove. It should be however noted that the present invention is not limited to the above-described embodiment, and may be altered in various ways, within the scope of claims set forth hereinbelow.

The present embodiment deals with a case where the thermostat valve is structured so that the opening degree of the valve increases with an increase in the temperature of the medium flowing into the valve so as to raise the flow rate of the medium, and the opening degree of the valve decreases with a decrease in the temperature of the medium flowing into the valve so as to reduce the flow rate of the medium.

However, use of the thermostat valve acting in the opposite way to the thermostat valve of the present embodiment is possible by, for example, changing the initial position of the valve of the thermostat valve. That is, the thermostat valve may be structured so that the opening degree of the valve is decreased with an increase in the temperature of the medium flowing into the valve so as to reduce the flow rate of the medium, and the opening degree of the valve increases with a decrease in the temperature of the medium flowing into the thermostat valve so as to raise the flow rate of the medium.

An exemplary use of such a thermostat valve acting in the opposite way to that of the present embodiment is a use for preheating the oil for a spoiler (lift damper) of an aircraft. The spoiler is a part of an aircraft lifted up at the time of landing. The oil for the spoiler is hardly used except for the time of landing the aircraft, and is usually cold. For this reason, there may be a problem that the spoiler cannot be lifted up when the aircraft lands.

To address this problem, a circuit separate from the circuit for circulating the oil for spoiler is provided, and the thermostat valve is provided to this separate circuit to preheat the oil. More specifically, the thermostat valve is structured to increase the opening degree of the valve with a decrease in the temperature of the medium flowing into the valve so as to raise the flow rate of the medium. Therefore, when the oil for the spoiler is cold, e.g., during the flight or when the aircraft is taking off, the opening degree of the thermostat valve is large. As the result, a large amount of oil is circulated in this separate circuit, and is preheated.

Meanwhile, the thermostat valve is structured to decrease the opening degree of the valve with an increase in the temperature of medium flowing into the valve so as to reduce the flow rate of the medium. Therefore, the opening degree of the thermostat valve is small, when the oil is warmed up, i.e., at the time of landing the aircraft. As the result, the amount of oil flowing in this separate circuit is reduced, and sufficiently warmed up oil is used for the spoiler side.

Thus, use of the thermostat valve in the opposite way to that of the present embodiment bring about a different effect such as a solution to the problem of failure in lifting up the spoiler.

REFERENCE NUMERALS 1 liquid cooling system for electric components in aircraft
2 pump
3 coolant feeding path
4 coolant discharging path
5 thermostat valve (flow rate adjusting valve)
11 main passage (feeding-side main passage)
12 branched path (feeding-side branched path)
13 main passage (discharging-side main passage)
14 branched path (discharging-side branched path)
31 valve housing
31a intake port
31b discharge port
32 valve actuation chamber
33 thermosensitive deformation member (bimetal)
33a one end
33b another end (the other end)
34 valve
50 electric component

What is claimed is:

1. A liquid cooling system for cooling an electric component with a use of a coolant, comprising:
    a flow rate adjusting valve configured to adjust a flow rate of the coolant fed to the electric component,
    wherein the flow rate adjusting valve comprises:
    a valve housing in which a valve actuation chamber is formed therein, the valve housing having an intake port and a discharge port of the coolant;
    a thermosensitive deformation member disposed in the valve actuation chamber so that one end thereof serves as a fixed end fixed to the valve housing and another end serves as a free end, the thermosensitive deformation member deforming according to the temperature of the coolant flowing into the valve actuation chamber; and
    a valve attached to the other end of the thermosensitive deformation member, which adjusts the opening degree of the intake port or the discharge port with displacement of the other end,
    wherein the thermosensitive deformation member is a bimetal formed in a helical shape, including two different metal plates with different coefficients of thermal expansion that are laminated,
    wherein the valve rotates with deformation of the bimetal to adjust the opening degree of the intake port or the discharge port, and
    wherein the flow rate adjusting valve is a thermostat valve configured so that, across the entire temperature range for which the thermostat valve is designed, an opening degree of the valve increases with an increase in the temperature of the coolant flowing into the flow rate adjusting valve so as to raise the flow rate of the coolant fed to the electric component, and the opening degree of the valve is decreased with a decrease in the temperature of the coolant flowing into the flow rate adjusting valve so as to reduce the flow rate of the coolant fed to the electric component.

2. The system according to claim 1, further comprising:
    a coolant feeding path connected to the electric component and coupled with a pump configured to feed a coolant to the electric component; and
    a coolant discharging path connected to the electric component, in which the coolant having cooled the electric component flows, wherein
    the electric component and the coolant feeding path, and the electric component and the coolant discharging path are made detachable.

3. The system according to claim 2, wherein
    the coolant feeding path has a feeding-side main passage to which the pump is provided, and a plurality of feeding-side branched paths connecting the feeding-side main passage with a plurality of the electric components,
    the coolant discharging path has a discharging-side main passage and a plurality of discharging-side branched paths connecting the discharging-side main passage with the electric components, and
    the flow rate adjusting valve is provided to each of the discharging-side branched paths.

* * * * *